(12) United States Patent
Bao et al.

(10) Patent No.: US 6,472,312 B2
(45) Date of Patent: Oct. 29, 2002

(54) METHODS FOR INHIBITING MICROELECTRONIC DAMASCENE PROCESSING INDUCED LOW DIELECTRIC CONSTANT DIELECTRIC LAYER PHYSICAL DEGRADATION

(75) Inventors: Tien-I Bao; Syun-Ming Jang, both of Hsin-Chu; Weng Chang, Taipei, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/761,485

(22) Filed: Jan. 16, 2001

(65) Prior Publication Data

US 2002/0094674 A1 Jul. 18, 2002

(51) Int. Cl.$^7$ ............................................. H01L 21/4763
(52) U.S. Cl. ........................ 438/633; 438/692; 438/618; 438/623; 438/624
(58) Field of Search ........................ 438/633, 691–692, 438/622–624, 629, 637, 612, 615, 618

(56) References Cited

U.S. PATENT DOCUMENTS

| | | | |
|---|---|---|---|
| 5,618,381 A | * | 4/1997 | Doan et al. .................. 438/633 |
| 5,973,387 A | | 10/1999 | Chen et al. |
| 5,985,125 A | * | 11/1999 | Kim ............................. 205/123 |
| 6,071,809 A | | 6/2000 | Zhao |
| 6,084,290 A | | 7/2000 | Shields |
| 6,096,230 A | * | 8/2000 | Schatz et al. .................. 216/38 |
| 6,133,619 A | | 10/2000 | Sahota et al. |
| 6,156,660 A | * | 12/2000 | Liu et al. ..................... 438/612 |
| 6,165,890 A | * | 12/2000 | Kohl et al. .................. 438/619 |
| 6,211,085 B1 | * | 4/2001 | Liu .............................. 438/624 |
| 6,214,719 B1 | * | 4/2001 | Nag ............................. 438/421 |

* cited by examiner

Primary Examiner—Tuan H. Nguyen
Assistant Examiner—Thanh Nguyen
(74) Attorney, Agent, or Firm—Tung & Associates

(57) ABSTRACT

Within a series of chemical mechanical polish (CMP) planarizing methods for forming a series of damascene structures within a series of microelectronic fabrications, there is employed at least one lateral offset width between: (1) a sidewall of a patterned dielectric layer and an edge of a substrate; (2) a sidewall of a patterned conductor layer and a sidewall of a patterned dielectric layer; and (3) a sidewall of a patterned second dielectric layer and a sidewall of a first dielectric layer. By employing the at least one lateral offset, there is provided the series of damascene structures with inhibited physical degradation of a patterned dielectric layer when forming within an aperture defined by the patterned dielectric layer a chemical mechanical polish (CMP) planarized patterned conductor layer.

6 Claims, 2 Drawing Sheets

METHODS FOR INHIBITING MICROELECTRONIC DAMASCENE PROCESSING INDUCED LOW DIELECTRIC CONSTANT DIELECTRIC LAYER PHYSICAL DEGRADATION

BACKGROUND OF THE INVENTION

1. Field of the Invention

The present invention relates generally to dielectric layers, as employed within microelectronic fabrications. More particularly, the present invention relates to methods for inhibiting microelectronic damascene processing induced physical degradation of dielectric layers, and in particular low dielectric constant dielectric layers, as employed within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common in the art of microelectronic fabrication to employ when fabricating microelectronic fabrications microelectronic dielectric layers formed of comparatively low dielectric constant dielectric materials. Comparatively low dielectric constant dielectric materials as employed for forming microelectronic dielectric layers within microelectronic fabrications, in comparison with conventional dielectric materials as employed for forming microelectronic dielectric layers within microelectronic fabrications, such as but not limited to conventional silicon oxide dielectric materials, conventional silicon nitride materials and conventional silicon oxynitride materials as employed for forming microelectronic dielectric layers within microelectronic fabrication, where such conventional dielectric materials typically have a dielectric constant. Such comparatively low dielectric constant dielectric materials as employed for forming microelectronic dielectric layers within microelectronic fabrications may include, but are not limited to, spin-on-polymer (SOP) dielectric materials, spin-on-glass (SOG) dielectric materials, amorphous carbon dielectric materials, fluorosilicate glass (FSG) dielectric materials and aerogel (i.e., air entrained) dielectric materials.

Comparatively low dielectric constant dielectric materials are desirable within the art of microelectronic fabrication for forming microelectronic dielectric layers interposed between the patterns of patterned microelectronic conductor layers within microelectronic fabrications insofar as within such applications comparatively low dielectric constant dielectric materials provide microelectronic fabrications with enhanced microelectronic fabrication speed, reduced microelectronic fabrication patterned conductor layer parasitic capacitance and reduced microelectronic fabrication patterned conductor layer cross-talk.

While comparatively low dielectric constant dielectric materials are thus desirable in the art of microelectronic fabrication for forming microelectronic dielectric layers interposed between the patterns of patterned microelectronic conductor layers within microelectronic fabrications, comparatively low dielectric constant dielectric constant dielectric materials are nonetheless not entirely without problems within microelectronic fabrications when employed for forming microelectronic dielectric layers interposed between the patterns of patterned microelectronic conductor layers within microelectronic fabrications. In that regard, and insofar as comparatively low dielectric constant dielectric materials typically have compromised physical properties in comparison with conventional dielectric materials, microelectronic dielectric layers when employed within microelectronic fabrications and formed of comparatively low dielectric constant dielectric materials often suffer from microelectronic processing induced physical degradation, such as but not limited to cracking and delamination, when fabricating a microelectronic fabrication while employing a microelectronic dielectric layer formed of a comparatively low dielectric constant dielectric material.

It is thus desirable in the art of microelectronic fabrication to provide methods through which microelectronic dielectric layers formed of comparatively low dielectric constant dielectric materials may be fabricated within microelectronic fabrications with inhibited microelectronic fabrication processing induced physical degradation.

It is towards the foregoing object that the present invention is directed.

Various methods have been disclosed in the art of microelectronic fabrication for forming microelectronic dielectric layers, and in particular microelectronic dielectric layers formed of low dielectric constant dielectric materials, with desirable properties in the art of microelectronic fabrication.

For example, Chen et al., in U.S. Pat. No. 5,973,387, discloses a method for reducing within a gap filling microelectronic dielectric layer formed interposed between a series of patterns which comprises a densely patterned microelectronic conductor layer formed over a microelectronic substrate employed within a microelectronic fabrication a cracking at a juncture of: (1) the series of patterns which comprises the densely patterned microelectronic conductor layer; and (2) an open area of the microelectronic substrate. To realize the foregoing object, the method employs within a pattern which comprises the densely patterned microelectronic conductor layer, where the pattern in turn adjoins the open area of the microelectronic substrate, a sidewall tapered in the direction of the open area of the microelectronic substrate.

In addition, Zhao, in U.S. Pat. No. 6,071,809, discloses a method for fabricating within a microelectronic fabrication a dual damascene structure formed employing a microelectronic dielectric layer formed of a low dielectric constant dielectric material, wherein there is avoided within the dual damascene structure delamination of the microelectronic dielectric layer when forming within the dual damascene structure a chemical mechanical polish (CMP) planarized patterned microelectronic conductor layer which also comprises the dual damascene structure. To realize the foregoing object, the method employs formed upon the microelectronic dielectric layer when forming the dual damascene structure a composite hard mask layer comprising a silicon nitride hard mask material having formed thereupon a silicon oxide hard mask material, wherein the silicon oxide hard mask material serves as a sacrificial mask material when chemical mechanical polish (CMP) planarizing within the dual damascene structure the chemical mechanical polish (CMP) planarized patterned microelectronic conductor layer within the dual damascene structure.

Further, Shields, in U.S. Pat. No. 6,084,290, discloses a microelectronic fabrication and a method for fabricating the microelectronic fabrication, wherein there is formed within the microelectronic fabrication an interlayer microelectronic dielectric layer formed of a hydrogen silsesquioxane (HSQ)

low dielectric constant dielectric material absent cracking within the interlayer microelectronic dielectric layer formed of the hydrogen silsesquioxane (HSQ) low dielectric constant dielectric material. To realize the foregoing object, the interlayer microelectronic dielectric layer formed of the hydrogen silsesquioxane (HSQ) low dielectric constant dielectric material is formed within the microelectronic fabrication upon a planar substrate layer, rather than a topographic substrate layer.

Finally, Sabota et al., in U.S. Pat. No. 6,133,619, discloses a microelectronic fabrication and a method for fabricating the microelectronic fabrication, wherein the microelectronic fabrication comprises a microelectronic dielectric layer formed of a low dielectric constant hydrogen silsesquioxane (HSQ) dielectric material formed interposed between a series of patterns which comprises a patterned microelectronic conductor layer within the microelectronic fabrication, and wherein there is reduced a hydrogen silsesquioxane (HSQ) dielectric material outgassing induced delamination of an upper lying barrier dielectric layer formed upon an upper lying patterned conductor layer within the microelectronic fabrication. To realize the foregoing object, there is formed upon the microelectronic dielectric layer formed of the low dielectric constant hydrogen silsesquioxane (HSQ) dielectric material a silicon oxide cap dielectric layer of thickness at least about 1000 angstroms.

Desirable in the art of microelectronic fabrication are additional methods through which microelectronic dielectric layers formed of comparatively low dielectric constant dielectric materials may be formed within microelectronic fabrications with inhibited microelectronic fabrication processing induced physical degradation.

It is towards the foregoing object that the present invention is directed.

SUMMARY OF THE INVENTION

A first object of the present invention is to provide a method for forming a low dielectric constant dielectric layer for use within a microelectronic fabrication.

A second object of the present invention is to provide a method in accord with the first object of the present invention, wherein the low dielectric constant dielectric layer is formed with inhibited microelectronic processing induced physical degradation.

A third object of the present invention is to provide a method in accord with the first object of the present invention and the second object of the present invention, wherein a method is readily commercially implemented.

In accord with the objects of the present invention, there is provided by the present invention three chemical mechanical polish (CMP) planarizing methods for forming a series of damascene structures within a series of microelectronic fabrications.

Within a first of the three chemical mechanical polish (CMP) planarizing methods, there is first provided a substrate. There is then formed over the substrate a patterned dielectric layer defining an aperture, where a sidewall of the patterned dielectric layer adjacent an edge of the substrate is laterally offset from the edge of the substrate by a lateral offset width. There is then formed over the patterned dielectric layer a blanket conductor layer which covers the sidewall of the patterned dielectric layer adjacent the edge of the substrate. Finally, there is then chemical mechanical polish (CMP) planarized the blanket conductor layer to form a chemical mechanical polish (CMP) planarized patterned conductor layer within the aperture and a chemical mechanical polish (CMP) planarized patterned conductor residue layer interposed between the sidewall of the patterned dielectric layer and the edge of the substrate.

Within a second of the three chemical mechanical polish (CMP) planarizing methods, there is also first provided a substrate. There is then also formed over the substrate a patterned dielectric layer defining an aperture, where a sidewall of the patterned dielectric layer adjacent an edge of the substrate is laterally offset from the edge of the substrate by a first lateral recess width. There is then formed over the patterned dielectric layer a patterned conductor layer which fills the aperture, where a sidewall of the patterned conductor layer is further laterally offset from the sidewall of the patterned dielectric layer by a second lateral offset width. There is then formed over the patterned conductor layer a blanket second dielectric layer which covers the sidewall of the patterned conductor layer and the sidewall of the patterned dielectric layer. Finally, there is then chemical mechanical polish (CMP) planarized the blanket second dielectric layer and the patterned conductor layer to form a chemical mechanical polish (CMP) planarized patterned conductor layer within the aperture and a chemical mechanical polish (CMP) planarized patterned second dielectric layer interposed between the sidewall of the patterned first dielectric layer and the edge of the substrate.

Within a third of the three chemical mechanical polish (CMP) planarizing methods, there is also first provided a substrate. There is then also formed over the substrate a first dielectric layer. There is then formed over the first dielectric layer a patterned second dielectric layer defining an aperture, where a sidewall of the patterned second dielectric layer is laterally offset from a sidewall of the first dielectric layer by a second lateral offset width. There is then formed over the first dielectric layer and the patterned second dielectric layer and completely filling the aperture a blanket conductor layer. Finally, there is then chemical mechanical polish (CMP) planarized the blanket conductor layer to form a chemical mechanical polish (CMP) planarized patterned conductor layer within the aperture.

The present invention provides a series of methods for forming a low dielectric constant dielectric layer for use within a microelectronic fabrication, wherein the low dielectric constant dielectric layer is formed with inhibited microelectronic processing induced physical degradation.

The present invention realizes the foregoing objects by providing a series of chemical mechanical polish (CMP) planarizing methods for forming a series of damascene structures within a series of microelectronic fabrications, wherein by employing a series of lateral offset widths with respect to: (1) a patterned dielectric layer sidewall and a substrate edge; (2) a patterned conductor layer and a patterned dielectric layer; and (3) a patterned second dielectric layer and a patterned first dielectric layer, within the series of microelectronic fabrications, and where the patterned dielectric layers may be formed of a low dielectric constant dielectric material, a series of chemical mechanical polish (CMP) planarized patterned conductor layers formed employing the series of chemical mechanical polish (CMP) planarizing methods is formed with inhibited microelectronic damascene processing induced physical degradation to the series of patterned dielectric layers.

The methods of the present invention are readily commercially implemented. As will be illustrated in greater detail within the context of the Description of the Preferred Embodiments, as set forth below, the methods of the present invention may be practiced employing materials as are otherwise generally conventional in the art of microelectronic fabrication, but employed within the context of specific process limitations to provide the methods of the present invention. Since it is thus a series of process limitations which provides at least in part the present invention, rather than the existence of materials which provides the present invention, the methods of the present invention are readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a series of methods for forming a low dielectric constant dielectric layer for use within a microelectronic fabrication, wherein the low dielectric constant dielectric layer is formed with inhibited microelectronic processing induced physical degradation.

The present invention realizes the foregoing objects by providing a series of chemical mechanical polish (CMP) planarizing methods for forming a series of damascene structures within a series of microelectronic fabrications, wherein by employing a series of lateral offset widths with respect to: (1) a patterned dielectric layer sidewall and a substrate edge; (2) a patterned conductor layer and a patterned dielectric layer; and (3) a patterned second dielectric layer and a patterned first dielectric layer, within the series of microelectronic fabrications, and where the patterned dielectric layers may be formed of a low dielectric constant dielectric material, a series of chemical mechanical polish (CMP) planarized patterned conductor layers formed employing the series of chemical mechanical polish (CMP) planarizing methods is formed with inhibited microelectronic damascene processing induced physical degradation to the series of patterned dielectric layers.

Although the present invention and the preferred embodiments of the present invention provide particular value with respect to inhibiting microelectronic processing induced physical degradation of dielectric layers, and in particular low dielectric constant dielectric layers, as employed within semiconductor integrated circuit microelectronic fabrications, the present invention may be employed for inhibiting microelectronic processing induced physical degradation of dielectric layers including but not limited to comparatively low dielectric constant dielectric layers and comparatively higher dielectric constant dielectric layers as employed for fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Figure 1:
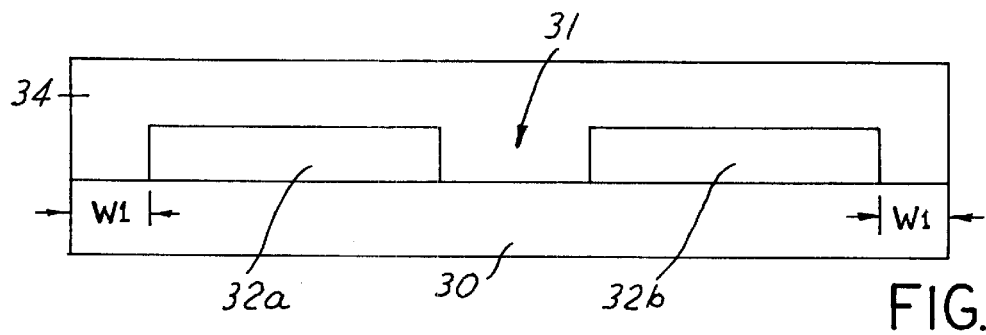
FIG. 1 and FIG. 2 show a pair of schematic cross-sectional diagrams illustrating the results of progressive stages in forming a microelectronic fabrication in accord with a first preferred embodiment of the present invention.
Figure 2:
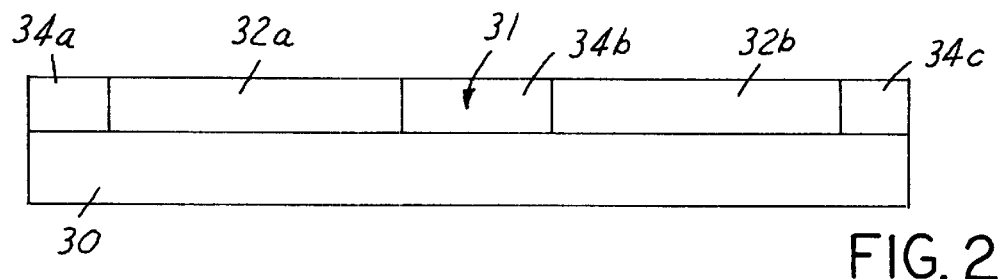

Referring now to FIG. 1 and FIG. 2, there is shown a pair of schematic cross-sectional diagrams illustrating the results of progressive stages of fabricating a microelectronic fabrication in accord with a first preferred embodiment of the present invention.

Shown in FIG. 1 is a schematic cross-sectional diagram of the microelectronic fabrication at an early stage in its fabrication in accord with the first preferred embodiment of the present invention.

Shown in FIG. 1, in a first instance, is a substrate 30 having formed thereupon a pair of patterned dielectric layers 32a and 32b which define an aperture 31.

Within the first preferred embodiment of the present invention with respect to the substrate 30, and as noted above, the substrate 30 may be employed when fabricating a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. More typically and preferably, within the present invention and the preferred embodiments of the present invention, the substrate 30 consists of or comprises a semiconductor substrate employed for fabricating a semiconductor integrated circuit microelectronic fabrication.

Although not specifically illustrated within the schematic cross-sectional diagram of FIG. 1, the substrate 30 may consist of a substrate alone as employed within the microelectronic fabrication, or in an alternative, the substrate 30 may comprise a substrate as employed within the microelectronic fabrication, where the substrate has formed thereupon and/or thereover any of several additional microelectronic layers as may be employed within the microelectronic fabrication within which is employed the substrate 30. Similarly with the substrate alone as employed within the microelectronic fabrication, such additional microelectronic layers may be formed from microelectronic materials including but not limited to microelectronic conductor materials, microelectronic semiconductor materials and microelectronic dielectric materials.

Similarly, and although also not specifically illustrated within the schematic cross sectional diagram of FIG. 1, and particularly but not exclusively under conditions where the substrate 30 consists of or comprises a semiconductor substrate as employed for fabricating a semiconductor integrated circuit microelectronic fabrication, the substrate 30 typically and preferably has formed therein and/or thereupon microelectronic devices as are conventionally employed within the microelectronic fabrication which is fabricated employing the substrate 30. Such microelectronic devices may include, but are not limited to, resistors, transistors, diodes and capacitors.

Within the first preferred embodiment of the present invention with respect to the pair of patterned dielectric layers 32a and 32b which define the aperture 31, and although the present invention may be employed when the pair of patterned dielectric layers 32a and 32b is formed from a dielectric material selected from the group including but not limited to comparatively low dielectric constant dielectric materials and comparatively higher dielectric constant dielectric materials, for the preferred embodiment of the present invention, the pair of patterned dielectric layers 32a and 32b is typically and preferably formed of a comparatively low dielectric constant dielectric material, such as but not limited to a spin on polymer (SOP) low dielectric constant dielectric material (such as but not limited to a polyimide spin-on-polymer (SOP), a polyarylene ether spin-on-polymer (SOP) or a fluorinated spin-on-polymer (SOP) analog thereof), a spin on glass (SOG) low dielectric constant dielectric material (such as but not limited to a silicate spin-on-glass (SOG) or a silsesquioxane spin-on-glass (SOG)), a fluorosilicate glass (FSG) low dielectric constant dielectric material, an amorphous carbon low dielectric constant dielectric material or an aerogel low dielectric constant dielectric material. As is illustrated within the schematic cross-sectional diagram of FIG. 1, and significant to the present invention, is that neither of the pair of patterned dielectric layers 32a and 32b reaches a corresponding edge of the substrate 30, but rather a sidewall of each of the patterned dielectric layers 32a and 32b adjacent a corresponding edge of the substrate 30 is laterally offset from the corresponding edge of the substrate 30 by a first lateral offset width W1 which may be effected employing a maskless edge bead etching method which etches and rinses from the first lateral offset width W1 portions of the substrate 30 portions of a blanket dielectric layer from which is formed the patterned dielectric layers 32a and 32b. Within the first preferred embodiment of the present invention, the first lateral offset width W1 is typically and preferably from about 100 to about 10000 microns, and more typically and preferably from about 100 to about 1000 microns. Typically and preferably, each of the pair of patterned dielectric layers 32a and 32b is formed to a thickness of from about 100 to about 10000 angstroms to define the aperture 31 of aperture width from about 10 to about 10000 microns.

Finally, there is also shown within the schematic cross-sectional diagram of FIG. 1 a blanket conductor layer 34 formed upon exposed portions of the substrate 30 and the pair of patterned dielectric layers 32a and 32b, while completely filling the aperture 31.

Within the first preferred embodiment of the present invention, it is significant that the blanket conductor layer 34 covers the sidewalls of the pair of patterned dielectric layers 32a and 32b adjacent the edges of the substrate 30 while completely filling the aperture 31.

Within the first preferred embodiment of the present invention, and al though the blanket conductor layer 34 may be formed from any of several conductor materials as are conventional in the art of microelectronic fabrication, including but not limited to aluminum, aluminum alloy, copper, copper alloy, doped polysilicon (having a dopant concentration of greater than about $10^4$ dopant atoms per cubic centimeter) and polycide (doped polysilicon/metal silicide stack) conductor materials, for the first preferred embodiment of the present invention the blanket conductor layer 34 is typically and preferably formed of a copper or copper alloy conductor material, typically laminated in conjunction with an appropriate barrier material, formed to a thickness of from about 10 to about 10000 angstroms upon exposed portions of the substrate 30 and the patterned dielectric layers 32a and 32b while completely filling the aperture 31.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket conductor layer 34 has been chemical mechanical polish (CMP) planarized to form a chemical mechanical polish (CMP) planarized patterned conductor layer 34b formed within the aperture 31 defined by the pair of patterned dielectric layers 32a and 32b, in conjunction with a pair of chemical mechanical polish (CMP) planarized patterned conductor residue layers 34a and 34c adjoining the sidewalls of the pair of patterned dielectric layers 32a and 32b adjacent the edges of the substrate 30 and interposed therebetween.

As is understood by a person skilled in the art, by employing within the context of the first preferred embodiment of the present invention the blanket conductor layer 34 which covers the sidewalls of the pair of patterned dielectric layers 32a and 32b adjacent the edges of the substrate 30 as effected by use of the pair of first lateral offset widths W1, there is inhibited physical degradation of the pair of patterned dielectric layers 32a and 32b when chemical mechanical polish (CMP) planarizing the blanket conductor layer 34, particularly when employing a linear (i.e., non-rotational) chemical mechanical polish (CMP) planarizing method, to form, primarily, the chemical mechanical polish (CMP) planarized patterned conductor layer 34b within the aperture 31 defined by the pair of patterned dielectric layers 32a and 32b.

Second Preferred Embodiment

Figure 3:
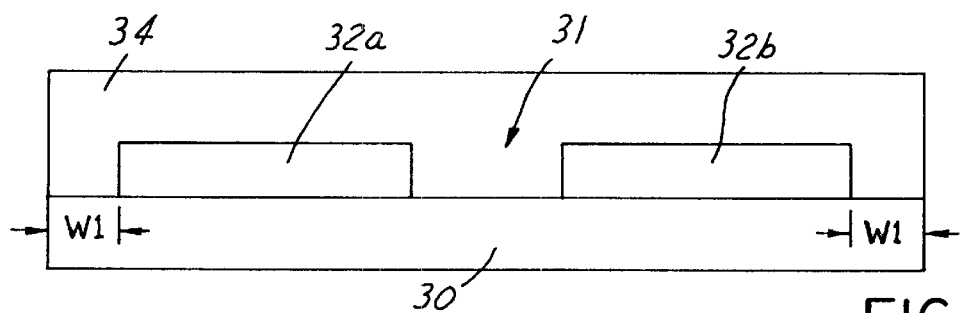
FIG. 3, FIG. 4 and FIG. 5 show a series of schematic cross-sectional diagrams illustrating the results of progressive stages in forming a microelectronic fabrication in accord with a second preferred embodiment of the present invention.
Figure 4:
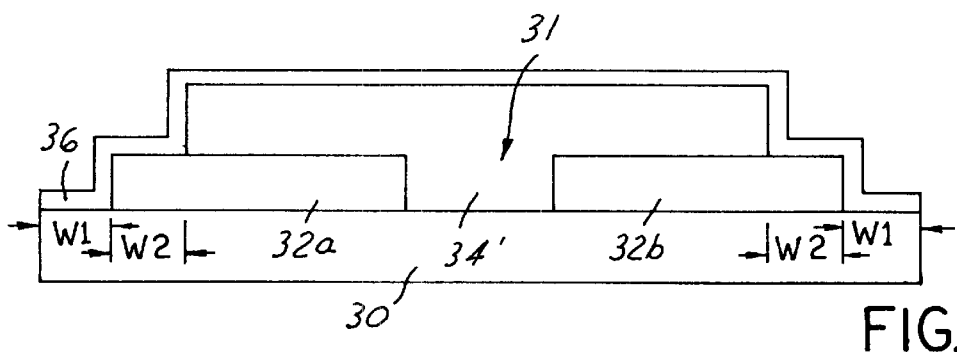
Figure 5:
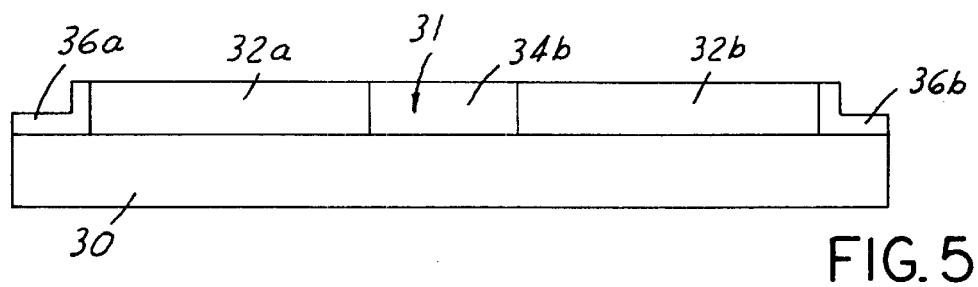

Referring now to FIG. 3 to FIG. 5, there is shown a series of schematic cross-sectional diagrams illustrating the results of progressive stages in fabricating a microelectronic fabrication in accord with a second preferred embodiment of the present invention.

Shown in FIG. 3 is a schematic cross-sectional diagram of the microelectronic fabrication at an early stage in its fabrication in accord with the second preferred embodiment of the present invention.

Shown in FIG. 3 is a schematic cross-sectional diagram of a microelectronic fabrication otherwise equivalent to the microelectronic fabrication whose schematic cross-sectional diagram is illustrated in FIG. 1, where equivalent microelectronic structures and equivalent microelectronic features are referenced with equivalent reference numerals.

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein, in a first instance, the blanket conductor layer 34 has been patterned to form a patterned conductor layer 34', and wherein a pair of sidewalls of the patterned conductor layer 34' is further laterally offset from the pair of sidewalls of the pair of patterned dielectric layers 32a and 32b by a pair of second lateral offset widths W2. Within the second preferred embodiment of the invention, the pair of second lateral offset widths W2 is typically and preferably from about 1 to about 10000 microns, more typically and preferably from about 1 to about 1000 microns.

Within the second preferred embodiment of the present invention, the blanket conductor layer 34 as illustrated within the schematic cross-sectional diagram of FIG. 3 may be patterned to form the patterned conductor layer 34' as illustrated within the schematic cross-sectional diagram of FIG. 4 while employing methods as are generally conventional in the art of microelectronic fabrication, but will typically and preferably include a maskless edge bead etching method which provides for enhanced manufacturing efficiency.

Shown also within the schematic cross-sectional diagram of FIG. 4 formed upon exposed portions of the substrate 30, the pair of patterned dielectric layers 32a and 32b and the patterned conductor layer 34' is a blanket dielectric barrier layer 36.

Within the second preferred embodiment of the present invention, the blanket dielectric barrier layer 36 is typically and preferably formed of a barrier dielectric material of a significantly higher hardness (typically and preferably greater than about 0.1 gigapascals and more typically and preferably from about 0.1 to about 100 gigapascals) than a dielectric material from which is formed the pair of patterned dielectric layers 32a and 32b (which typically and preferably has a hardness of from about 0.1 to about 100 gigapascals). Thus typically and preferably, within the second preferred embodiment of the present invention the blanket dielectric barrier layer 36 will typically and preferably be formed of a barrier dielectric material such as but not limited to a high density (i.e., greater than about 1 grams per cubic centimeter) silicon oxide barrier dielectric material, silicon nitride barrier dielectric material or silicon oxynitride barrier dielectric material, typically and preferably formed to a thickness of from about 10 to about 10000 angstroms.

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein the blanket dielectric barrier layer 36 and the patterned conductor layer 34' have been sequentially chemical mechanical polish (CMP) planarized to form within the aperture 31 the chemical mechanical polish (CMP) planarized patterned conductor layer 34b and to also form at the sidewalls the pair of patterned dielectric layers 32a and 32b adjacent the edges of the substrate 30 a pair of chemical mechanical polish (CMP) planarized patterned dielectric barrier layers 36a and 36b interposed therebetween.

As is understood by a person skilled in the art, within the second preferred embodiment of the present invention the pair of chemical mechanical polish (CMP) planarized patterned dielectric barrier layers 36a and 36b provides for inhibited physical degradation of the pair of patterned dielectric layers 32a and 32b when chemical mechanical polish (CMP) planarizing the patterned conductor layer 34' to form the chemical mechanical polish (CMP) planarized patterned conductor layer 34b formed within the aperture 31, particularly while employing a linear chemical mechanical polish (CMP) planarizing method.

Third Preferred Embodiment

Referring now to FIG. 6 to FIG. 10 there is show a series of schematic cross-sectional diagrams illustrating the results of progressive stages of fabricating a microelectronic fabrication in accord with a third preferred embodiment of the present invention.

Figure 6:
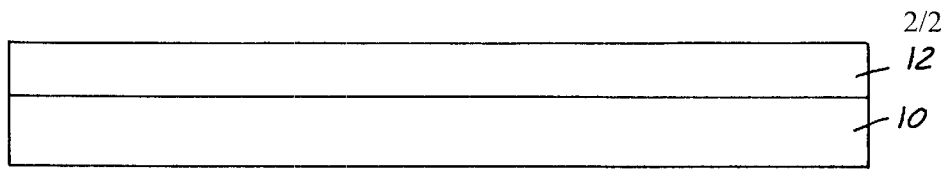
FIG. 6, FIG. 7, FIG. 8, FIG. 9 and FIG. 10 show a series of schematic cross-sectional diagrams illustrating the results of progressive stages in forming a microelectronic fabrication in accord with a third preferred embodiment of the present invention.

Shown in FIG. 6 is a schematic cross-sectional diagram of the microelectronic fabrication at an early stage in its fabrication in accord with the third preferred embodiment of the present invention.

Shown in FIG. 6 is a substrate 10 having formed thereupon a blanket first dielectric layer 12.

Within the third preferred embodiment of the present invention, the substrate 10 is otherwise generally analogous or equivalent to the substrate 30 as employed within the first preferred embodiment of the present invention as illustrated within the schematic cross-sectional diagram of FIG. 1 and the second preferred embodiment of the present invention as illustrated within the schematic cross-sectional diagram of FIG. 3. Similarly, within the third preferred embodiment of the present invention, the blanket first dielectric layer 12 is typically and preferably formed employing methods, materials and dimensions analogous or equivalent to the methods, materials and dimensions employed for forming the patterned dielectric layers 32a and 32b within the first preferred embodiment of the present invention as illustrated within the schematic cross-sectional diagram of FIG. 1 and the second preferred embodiment of the present invention as illustrated within the schematic cross-sectional diagram of FIG. 3.

Figure 7:
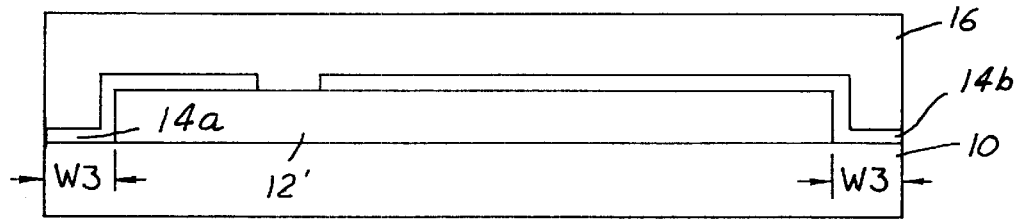

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein, in a first instance, the blanket first dielectric layer 12 has been patterned to form a patterned first dielectric layer 12'. Within the third preferred embodiment of the present invention, and although the blanket first dielectric layer 12 may be patterned to form the patterned first dielectric layer 12' while employing any of several methods, the blanket first dielectric layer 12 is typically and preferably patterned to form the patterned first dielectric layer 12' while employing a maskless edge bead stripping method. Typically and preferably, a pair of sidewalls of the patterned first dielectric layer 12' is formed with a first lateral offset width W3 with respect to an adjacent pair of edges of the substrate 10 as illustrated within the schematic cross-sectional diagram of FIG. 7 of from about 1 to about 10000 microns, more typically and preferably of from about 1 to about 1000 microns.

There is also shown within the schematic cross-sectional diagram of FIG. 7 formed upon exposed portions of the substrate 10 and the patterned first dielectric layer 12' a pair of patterned etch stop layers 14a and 14b which define the location of a via to be subsequently formed through the patterned first dielectric layer 12'.

Within the third preferred embodiment of the present invention, the pair of patterned etch stop layers 14a and 14b is typically and preferably formed employing methods, materials and dimensions analogous or equivalent to the methods, materials and dimensions employed for forming the blanket dielectric barrier layer 36 as employed within the second preferred embodiment of the present invention and as illustrated within the schematic cross-sectional diagram of FIG. 4.

Finally, there is also shown within the schematic cross-sectional diagram of FIG. 7 a blanket second dielectric layer 16 formed upon exposed portions of the pair of patterned etch stop layers 14a and 14b and the patterned first dielectric layer 12'. Within the third preferred embodiment of the present invention, the blanket second dielectric layer 16 is typically and preferably formed employing methods, materials and dimensions analogous or equivalent to the methods, materials and dimensions employed for forming the blanket first dielectric layer 12 as illustrated within the schematic cross-sectional diagram of FIG. 6.

Figure 8:
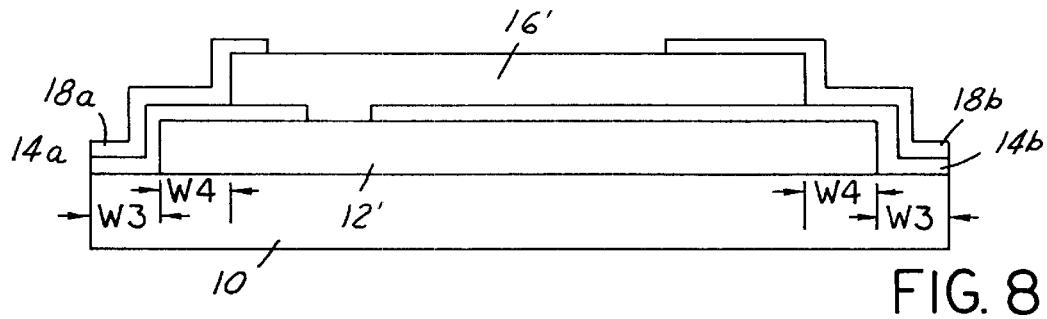

Referring now to FIG. 8, there is shown a schematic cross-sectional diagram illustrating the results of further processing of the microelectronic fabrication whose schematic cross-sectional diagram is illustrated in FIG. 7.

Shown in FIG. 8 is a schematic cross-sectional diagram of a microelectronic fabrication otherwise equivalent to the microelectronic fabrication whose schematic cross-sectional diagram is illustrated in FIG. 7, but wherein, in a first instance, the blanket second dielectric layer 16 has been patterned to form a patterned second dielectric layer 16'.

Within the third preferred embodiment of the present invention, the blanket second dielectric layer 16 as illustrated within the schematic cross-sectional diagram of FIG. 7 may be patterned to form the patterned second dielectric layer 16' as illustrated within the schematic cross-sectional diagram of FIG. 8 while employing methods and materials analogous or equivalent to the methods and materials employed for forming from the blanket first dielectric layer 12 as illustrated within the schematic cross-sectional diagram of FIG. 6 the patterned first dielectric layer 12' as illustrated within the schematic cross-sectional diagram of FIG. 7. Similarly, as is illustrated within the schematic cross-sectional diagram of FIG. 8, a pair of sidewalls of the patterned second dielectric layer 16' has a second lateral offset width W4 with respect to the pair of sidewalls of the patterned first dielectric layer 12'. Typically and preferably, the second lateral offset width is from about 1 to about 10000 microns, more typically and preferably, the second lateral offset width is from about 1 to about 1000 microns.

Shown also within the schematic cross-sectional diagram of FIG. 8 is a pair of patterned polish stop layers 18a and 18b formed upon exposed portions of the patterned etch stop layers 14a and 14b and the patterned second dielectric layer 16'.

Within the third preferred embodiment of the present invention, the pair of patterned polish stop layers 18a and 18b is typically and preferably formed employing methods, materials and dimensions analogous or equivalent to the methods, materials and dimensions employed for forming the pair of patterned etch stop layers 14a and 14b. As is understood by a person skilled in the art, the pair of patterned polish stop layers 18a and 18b serves sequentially as a pair of etch mask layers for defining a trench within the patterned second dielectric layer 16' of dimensions greater than and overlapping with the dimensions of the via to be formed within the patterned first dielectric layer 12'.

Figure 9:
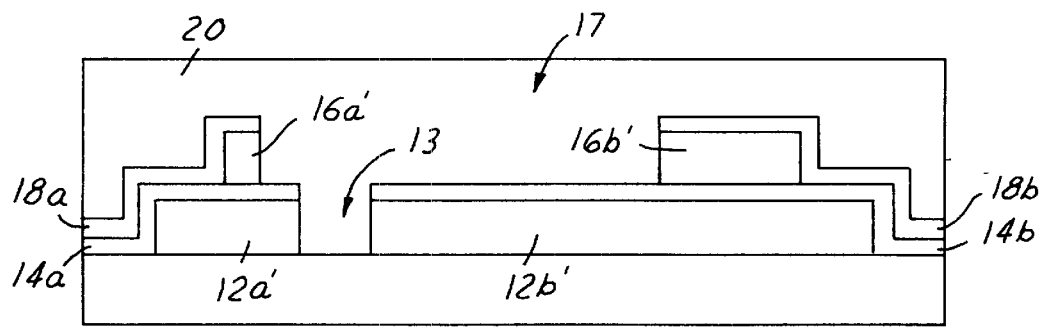

Referring now to FIG. 9, there is shown a schematic cross-sectional diagram illustrating the results of further processing of the microelectronic fabrication whose schematic cross-sectional diagram is illustrated in FIG. 8.

Shown in FIG. 9 is a schematic cross-sectional diagram of a microelectronic fabrication otherwise equivalent to the microelectronic fabrication whose schematic cross-sectional diagram is illustrated in FIG. 8, but wherein, in a first instance: (1) the patterned second dielectric layer 16' has been further patterned to form a pair of twice patterned second dielectric layers 16a' and 16b' which define a trench 17; and (2) the patterned first dielectric layer 12' has been further patterned to form a pair of twice patterned first dielectric layers 12a' and 12b' which define a via 13 smaller than and contiguous with the trench 17, while employing as an etch mask the pair of patterned polish stop layers 18a and 18b and the pair of patterned etch stop layers 14a and 14b.

Within the third preferred embodiment of the present invention, the patterned second dielectric layer 16' may be further patterned to form the pair of twice patterned second dielectric layers 16a' and 16b' and the patterned first dielectric layer 12' may be further patterned to form the pair of twice patterned first dielectric layers 12a' and 12b' while employing etch methods, and in particular plasma etch methods, as are otherwise conventional in the art of microelectronic fabrication.

Finally, there is also shown within the schematic cross-sectional diagram of FIG. 9 a blanket conductor layer 20 formed covering exposed portions of the patterned polish stop layers 18a and 18b, the twice patterned second dielectric layers 16a' and 16b', the patterned etch stop layers 14a and 14b, the twice patterned first dielectric layers 12a' and 12b' and the substrate 10 while completely filling the via 13 contiguous with the trench 17.

Within the second preferred embodiment of the present invention, the blanket conductor layer 20 may be formed employing methods and materials as are analogous or equivalent to the methods and materials as are employed for forming the blanket conductor layer 34 within the first preferred embodiment of the present invention as illustrated within the schematic cross-sectional diagram of FIG. 1 and the second preferred embodiment of the present invention as illustrated within the schematic cross-sectional diagram of FIG. 3.

Figure 10:
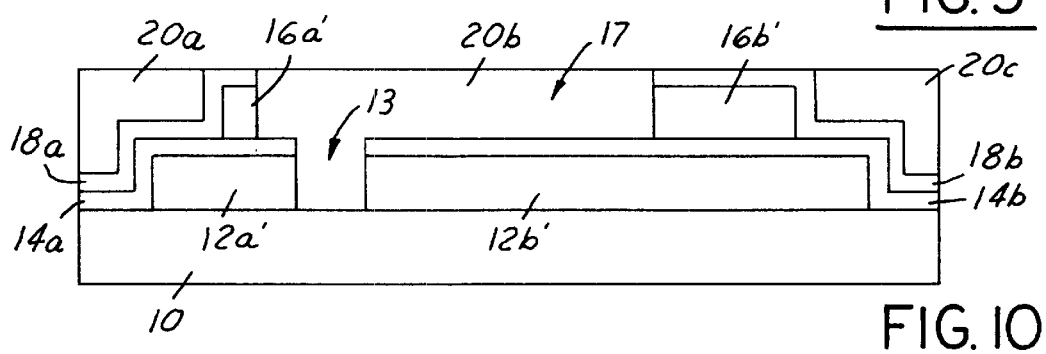

Referring now to FIG. 10, there is shown a schematic cross-sectional diagram illustrating the results of further processing of the microelectronic fabrication whose schematic cross-sectional diagram is illustrated in FIG. 9.

Shown in FIG. 10 is a schematic cross-sectional diagram of a microelectronic fabrication otherwise equivalent to the microelectronic fabrication whose schematic cross-sectional diagram is illustrated in FIG. 9, but wherein the blanket conductor layer 20 has been chemical mechanical polish (CMP) planarized to form a chemical mechanical polish (CMP) planarized contiguous patterned conductor stud layer and patterned conductor interconnect layer 20b within the via 13 contiguous with the trench 17, as well as a pair of chemical mechanical polish (CMP) planarized patterned conductor residue layers 20a and 20c.

As is understood by a person skilled in the art, by employing within the context of the third preferred embodiment of the present invention a series of progressive lateral offsets including the pair of fourth lateral offset widths W4 for the patterned second dielectric layer 16' with respect to the patterned first dielectric layer 12', there is provided within the context of the present invention a reduced physical degradation of the twice patterned second dielectric layers 16a' and 16b' and the twice patterned first dielectric layers 12a' and 12b' when forming while employing a chemical mechanical polish (CMP) planarizing method the chemical mechanical polish (CMP) planarized contiguous patterned conductor stud layer and patterned conductor interconnect layer 20b within the via 13 contiguous with the trench 17, particularly while employing a linear chemical mechanical polish (CMP) planarizing method.

As is understood by a person skilled in the art, the preferred embodiments of the present invention are illustrative of the present invention rather than limiting of the present invention. Revisions and modifications may be made to methods, materials, structures and dimensions through which is provided a microelectronic fabrication in accord with the preferred embodiments of the present invention while still providing a method for fabricating a damascene structure in accord with the present invention, further in accord with the accompanying claims.

What is claimed is:

1. A method for forming a damascene structure comprising:

provinding a substrate;

forming over the substrate a patterned dielectric layer which defines an aperture, where a sidewall of the patterned dielectric layer adjacent an edge of the substrate is laterally offset from the edge of the substrate by a lateral offset width;

forming over the patterned dielectric layer a blanket conductor layer which fills the aperture and covers the sidewall of the patterned dielectric layer laterally offset from the edge of the substrate;

chemical mechanical polish (CMP) planarizing the blanket conductor layer to form a chemical mechanical polish (CMP) planarized patterned conductor layer within the aperture and a chemical mechanical polish (CMP) planarized patterned conductor residue layer interposed between the sidewall of the patterned dielectric layer and the edge of the substrate.

2. The method of claim 1 wherein by employing the lateral offset width of the sidewall of the patterned dielectric layer with respect to the edge of the substrate, there is inhibited physical degradation of the patterned dielectric layer when forming the chemical mechanical polish (CMP) planarized patterned conductor layer within the aperture.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the dielectric layer is formed from a dielectric material selected from the group consisting of spin-on-polymer (SOP) dielectric materials, spin-on-glass (SOG) dielectric materials, fluorosilicate glass (FSG) dielectric materials, amorphous carbon dielectric materials and aerogel dielectric materials.

5. The method of claim 1 wherein the lateral offset width is from about 1 to about 10000 microns.

6. The method of claim 1 wherein the lateral offset width of the sidewall of the patterned dielectric layer with respect to the edge of the substrate is formed employing a maskless edge bead etching method.

* * * * *